United States Patent [19]

Muzyczko et al.

[11] 4,268,608

[45] * May 19, 1981

[54] DEVICE FOR USE IN PHOTOCHEMICAL AND PHOTOMECHANICAL PROCESSES

[75] Inventors: Thaddeus M. Muzyczko, Downers Grove; Thomas H. Jones, Naperville, both of Ill.

[73] Assignee: The Richardson Company, Des Plaines, Ill.

[*] Notice: The portion of the term of this patent subsequent to May 29, 1996, has been disclaimed.

[21] Appl. No.: 42,434

[22] Filed: May 25, 1979

Related U.S. Application Data

[63] Continuation of Ser. No. 854,703, Nov. 25, 1977, Pat. No. 4,156,612, which is a continuation-in-part of Ser. No. 704,494, Jul. 12, 1976, Pat. No. 4,065,314, which is a continuation of Ser. No. 585,215, Jun. 9, 1975, Pat. No. 3,969,119, which is a continuation of Ser. No. 267,475, Jun. 29, 1972, Pat. No. 3,888,671.

[51] Int. Cl.³ ........................ G03C 1/68; G03C 5/00
[52] U.S. Cl. .................................. 430/270; 101/456; 204/159.14; 430/280; 430/300; 430/310; 430/302; 430/313; 430/323; 430/325
[58] Field of Search .............. 430/270, 280, 300, 310, 430/302, 313, 323, 325; 204/159.14, 159.15, 159.19; 101/456; 260/31.4, 31.6

[56] References Cited

U.S. PATENT DOCUMENTS

| | | | |
|---|---|---|---|
| 3,888,671 | 6/1975 | Muzyczko et al. | 430/270 |
| 3,969,119 | 7/1976 | Muzyczko et al. | 430/270 |
| 4,065,314 | 12/1977 | Muzyczko et al. | 430/280 |
| 4,156,612 | 5/1979 | Muzyczko et al. | 430/270 |

*Primary Examiner*—Edward C. Kimlin
*Attorney, Agent, or Firm*—Lockwood, Dewey, Alex & Cummings

[57] ABSTRACT

A photoreactive composition containing an effective amount of a polymer which includes as a recurring structure:

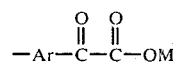

wherein Ar is a bivalent aromatic radical, and M is selected from the class consisting of hydrogen, alkali metal, ammonium, and substituted ammonium. These compositions are useful in a wide variety of photochemical and photomechanical processes and are particularly suited for use as photopolymers, photoinitiators and photosensitizers in light sensitive coatings of presensitized lithographic plates.

7 Claims, No Drawings

DEVICE FOR USE IN PHOTOCHEMICAL AND PHOTOMECHANICAL PROCESSES

This is a continuation, of application Ser. No. 854,703, filed Nov. 25, 1977, now U.S. Pat. No. 4,156,612 which, in turn, is a continuation-in-part of prior copending application Ser. No. 704,494 now U.S. Pat. No. 4,065,314, which, in turn, was a continuation of application Ser. No. 585,215, filed June 9, 1975, now U.S. Pat. No. 3,969,119 which, in turn, was a division of application Ser. No. 267,475, filed June 29, 1972, now U.S. Pat. No. 3,888,671.

BACKGROUND AND DESCRIPTION OF THE INVENTION

This invention generally relates to novel photosensitive compositions which are useful in a wide variety of photochemical processes such as, for example, planographic, letterpress, gravure and silk screen printing processes as well as photomechanical processes such as, for example, the production of printed circuits, chemical milling and chemical etching. An important aspect of the present invention is directed to novel photoreactive compositions which are especially suitable for use as photopolymers, photoinitiators and photosensitizers in light sensitive coatings used in lithographic plates.

In commercial lithography, a light sensitive coating on a backing member is generally subjected to a controlled light exposure and thereafter developed to provide an image area which is insoluble in a particular solvent and a non-image area which is soluble in that solvent. Typically, the image area is grease-receptive and water repellent, while the non-image area is water-receptive and grease-repellent. Oil-based inks therefore adhere only to the image area, from which they can be transferred to a surface in a suitable printing operation such as, for example, by offset printing.

Early lithographic plates typically had light sensitive surface coatings which generally contained bichromated colloids such as bichromated albumin that underwent a sol-gel transformation upon being subjected to light. Since these bichromated colloids are sensitive to moisture, they deteriorate rapidly on being subjected to atmospheric conditions and their use has been generally limited to so-called wipe-on plates, that is, systems wherein the light sensitive bichromated coating is applied to the plate or backing member immediately prior to its being exposed to light.

Subsequently, light sensitive diazo compounds have been used as the light sensitive coating in presensitized lithographic plates, namely, plates which have the light sensitized diazo coating applied thereto prior to actual use. While diazo-sensitized plates are extensively commercially used at this time, they are characterized by certain disadvantages which include, for example, limited shelf life, and the need for a barrier coating between the diazo coating and the backing member. In addition, the diazo coatings present handling problems by reason of their sensitivity to heat, moisture and tungsten light.

More recently, the efforts to overcome the disadvantages of the above mentioned prior art compositions have involved the use of photopolymer coatings which can be applied to a suitable backing member long prior to actual use and which, upon being subjected to light, become insolubilized by polymerization or crosslinking. These photopolymer coatings have been composed of various materials, for example, the cinnamate ester resins of polyvinyl alcohol and cellulose as well as those based on epoxy resins. Similarly, acrylic coatings and polyamide coatings are other types of photopolymerizable coatings which have been discussed in the prior art. These known photopolymer coatings, however, often require the addition of photosensitizers and photoinitiators. Also, when used in lithographic plates, these known photopolymer coatings have presented relatively difficult manufacturing problems and have required development procedures which are more complex than desired.

It is, therefore, an important object of the present invention to provide a new class of photosensitive compositions characterized by improved photoreactive properties enabling them to be used in a wide variety of photochemical and photomechanical processes.

Another object of the present invention is to provide a new and useful class of photoreactive compositions which are useful in virtually all printing processes including planographic, relief, gravure and silk screen printing processes.

Another object of the present invention is to provide a new and useful class of photoreactive compositions which can be used alone, or if desired, in conjunction with a wide variety of resins, both saturated and unsaturated, to provide improved photoreactive coatings.

Another object of the present invention is to provide a class of novel photoreactive compositions which include an effective amount of multi-functional glyoxylated substituents.

Another object of the present invention is to provide a class of photoreactive polymeric compositions advantageously suitable for use as photoinitiators, photosensitizers or photopolymers, which compositions include, as a repeated structure, a plurality of glyoxylated groups, present either wholly or partially as pendant groups from the polymeric chain which exhibit advantageous oxygen insensitivity.

Another object of the present invention is to provide a class of photoreactive compositions suitable for use as photoinitiators, photosensitizers, and photopolymers characterized by long shelf life, enabling them to be particularly suitable for use in presensitized lithographic plates.

Another object of the present invention is to provide a class of photoreactive compositions which can be used alone or in conjunction with a wide variety of resins, to provide photoreactive coatings which are developable with water or alcohol-based solvents or desensitizers.

Another object of the present invention is to provide a class of improved photoreactive compositions which, upon controlled exposure to actinic light, are capable of forming insoluble image areas that exhibit long running characteristics on backing members in lithographic plates.

Another object of the present invention is to provide a class of improved photoreactive compositions which can be used in ink and coating formulations to make such ink and coating formulations photocurable.

These and other objects of the present invention will be apparent to those skilled in the art from reading the following more detailed description.

In accordance with an important aspect of the present invention, novel polymers are provided which are soluble in a suitable solvent, typically an aqueous solvent or an organic solvent such as acetone or methylethyl ketone.

These novel polymers, upon exposure to actinic light, photoreact and become insoluble. As such, the polymers of this invention are particularly suitable for use in photoreactive processes including photochemical as well as photomechanical processes and find advantageous use either alone, or in conjunction with other materials, in photoreactive coatings used on lithographic plates.

The novel compositions of this invention generally comprise polymers which include as a recurring structure:

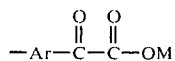

wherein Ar is a bivalent aromatic radical and M is selected from the class consisting of hydrogen, alkali metal, ammonium and substituted ammonium.

In the above formula, the preferred alkali metals in the M group are sodium, potassium and lithium. Correspondingly, the substituted ammonium substituents encompassed by the definition of the M group are those which provide a compound which is water soluble and include, for example, triethylamine, ethylamine, aniline, substituted aniline (e.g. chloroaniline, cyanoaniline and methyoxyaniline), pyridine, substituted pyridine (e.g. picoline and 2,6-lutidine), the alkanolamines such as, for example, mono, di and tri-alkanolamines wherein the alkanol group is ethanol or isopropanol, the alkylamines such as, for example, the mono, di and tri-alkylamines wherein the alkyl group is ethyl or propyl, morpholine and the cycloaliphatic amines such as, for example, cyclohexylamine.

As used herein, the "Ar" group is intended to include all bivalent structures exhibiting aromaticity, including: carbon ring structures such as, for example, phenylene, diphenylene and the like; fused ring structures such as, for example, bivalent derivatives of pyridine, furan, thiophene, pyrrole, quinoline, indole, and the like. In the preferred embodiments of this invention, however, the "Ar" groups are phenylene and naphthalene.

The compositions of the present invention are polymeric in form and include polymers wherein the abovedefined recurring structure is present as a part of the polymeric backbone as well as polymers wherein the recurring structure is present as pendant groups from a backbone structure, the chemical nature of which is not critical except in its ability to partically incorporate and/or bondably connect with aromaticglyoxy groups generally in accordance with the aforementioned structure. As such, these polymeric backbone structures can be organic, organometallic or inorganic and be in oligomeric or polymeric form. In this regard, it should be noted that the term polymeric is used to include homopolymers and copolymers which are characterized by two or more dissimilar monomeric units and are produced by polymerization, condensation or addition. These copolymers can be in graft, random or alternating form. Examples of suitable backbones include: the aliphatics such as methylene, ethylene and propylene; the aromatics such as phenylene, biphenylene, naphthalene and anthracene; the substituted aromatics such as tolylene, ethylphenylene, aminophenylene, alkoxyphenylenes (e.g. methoxyphenylene), cyanophenylene, hydroxyphenylene, the halophenylenes (e.g. chlorophenylene), ethylnaphthalene, carboxyphenylene, difunctional drivatives of the phthalates and substituted phthalates such as the hydroxy alkylphthalate compounds (e.g. hydroxyethylphthalate) and acyloxyphenylenes (e.g. acetoxyphenylene); cyclic hydrocarbons such as difunctional derivatives of cyclopentane and cyclohexane; heterocyclics such as difunctional derivatives of thiophene and pyrrole; the organometallics such as difunctional derivatives of the metallocenes such as ferrocene and cuprocene; polymeric materials such as the polyalkylenes (e.g. polyethylene, polypropylene and polybutylene); polyesters such as polyethyleneterephthalate and polyethyleneadipate; polyurethanes such as the toluene diisocyanate polyol urethanes; polyamides such as polyhexamethyleneadipamide; copolymers such as vinylidene chloride/vinyl chloride copolymers; the polysiloxanes; the polyalkyleneoxides (e.g. polyethylene oxide, polypropylene oxide, polybutylene oxide, polytetramethylene ether and polyepichlorohydrin); the polyalkylene imines such as polyethylenimine and polypropylenimine; substituted polyalkylenes such as polyvinylpyrrolidone; and phenolic derivatives such as novolac, resole and polyphenylene oxide.

As previously noted, photoreactive compositions of the present invention can be used alone or in conjunction with other materials to provide photoreactive compositions suitable in a wide variety of photomechanical and photochemical processes. For example, these novel compositions exhibit advantageous utility as photoinitiators with both saturated and unsaturated resins including resins which are not photosensitive in themselves. In particular, durable insoluble photoreaction products have been formed through the conjoint use of the photoreactive compositions of the present invention as photosensitizers with a wide variety of resins, including: the acrylic polymers and acrylic ester resins such as polymethylmethacrylate, polyethylmethacrylate, and copolymers of methyl and butyl methacrylate (e.g. "Elvacite"); polyurethane resins such as those formed by reacting diisocyanates such as, for example, toluene diisocyanate with low molecular weight polyesters or low molecular weight polyethylene glycols (e.g. "Estane" polyurethane resins); blocked urethane resins such as, for example, phenol blocked polyurethane resins (e.g. "Tranco 3A" blocked urethane resins); alkyl celluloses such as ethyl cellulose (e.g. "Hercules K-type" ethyl cellulose); epoxy resins (e.g. "Epon 1004" which is the condensation product formed from bisphenol A and epichlorohydrin); phenoxy resins (e.g. "Bakelite PKHH" phenoxy resin); vinyl acetate/vinyl chloride copolymers (e.g. "Bakelite VYHH" an 86% vinyl chloride, 14% vinyl acetate copolymer medium molecular weight resin); vinyl modified polyethylene such as ethylene/vinyl acetate copolymer containing 2 to 50% vinyl acetate ("Ultrathene" ethylene/vinyl acetate copolymer); partially (5 to 80%) hydrolyzed vinyl acetate resin (e.g. "Bakelite" MA 28-18 18% hydrolyzed vinyl acetate); phenolic resins (e.g. "Plenco 1000" novolac resin); acrylamide and modified acrylamide polymers such as diacetone acrylamide homopolymer, N-methylol acrylamide, N-alkoxymethyl acrylamide and partially hydrolyzed acrylamide; water-soluble cellulose derivatives such as the hydroxyethylated celluloses and hydroxypropyl cellose (e.g. "Klucel" hydroxypropyl cellulose); and water-soluble polyether resins such as the polyalkylene oxides (e.g. "Polyox WSRN-80" polyethylene oxide).

The amount of the aromaticglyoxy substituted polymers of the present invention which will be used in a given photoreactive composition will vary over a broad range depending upon the intended function of the compound in the composition. For this reason, the concentration of these constituents in a given photoreactive composition is best described as an "effective amount" and ranges from 0.01% to 100% based on the total weight of reactive material in the composition. For example, when these aromaticglyoxy substituted polymers are used as photoinitiators in a particular coating composition which includes polymerizable monomers (for example, acrylic or vinyl monomers), the amounts of these compounds will generally range from approximately 0.01% to 10% by weight, based on the total weight of reactive material in the composition. When used as a photopolymer with other resins, whether saturated or unsaturated, however, the amounts of the aromaticglyoxy substituted polymers of the present invention can be as low as 5 weight percent and still provide a satisfactory photoreactive coating which, upon being subjected to actinic radiation forms an insoluble species. However, amounts of aromaticglyoxy substituted polymers of the present invention of at least 50 weight percent are preferred for photoreactive coatings suitable for most end uses. Correspondingly, the novel polymers of the present invention can be used alone, that is, without any other thermoplastic resin, to provide a photoreactive coating composition which can be advantageously employed in virtually all photochemical and photomechanical processes including, in particular, the manufacture of presensitized lithographic plates.

In those embodiments of the present invention wherein the aromaticglyoxy groups are wholly or partially present as pendant groups from the polymeric chain, the degree of substitution of these glyoxy substituents can best be described as an amount sufficient to provide the polymer with the ability to form an insoluble species upon being subjected to light. Since the acid form of these compounds is preferred in applications wherein these compounds are applied as a solution to a backing or support member, the minimum degree of substitution which is preferred with such embodiments is that amount which will provide an overall composition soluble in the solvent used in such solution. In this regard, the preferred minimum degree of substitution of the acid form of the aromaticglyoxy groups on a polymeric backbone is that amount which provides an overall compound which is soluble in an aqueous alkaline solution.

If desired, known photoactive compounds may be used in photoreactive compositions which include the aromaticglyoxy substituted polymers of the present invention to impart improved photoeffectiveness thereto or for imparting other desired film characteristics thereto. Illustrative examples of such photoactive compounds include the various ketones, guinones, aldehydes, aromatic compounds, conjugated aromatics and olefins, aromatic nitrogen compounds, peroxides and peroxide compounds, and the miscellaneous photoactive compounds specified in U.S. Pat. No. 4,046,577 at column 5, line 50, through column 9, line 42, the disclosure of which is incorporated herein by reference.

These compounds, oligomers and polymers may enhance the performance of the base aromaticglyoxy polymers of the present invention by changes in spectral response. They or counterparts thereof which exhibit similar properties and characteristics may be used with the polymers of the present invention or with such polymers and an unsaturated species. Correspondingly, if desired, combination of two or more of these sensitizers may be advantageously employed. For example, benzoin and Michlers ketone, benzophenone and thio-Michlers ketone, benzophenone and triethanolamine, etc. Any single species or combination may be used as long as the storage stability, due to premature decomposition, is not affected. Certain of these compounds and even solvents are believed to have ordering as well as plasticizing effects which are beneficial. By plasticizing, functional group or segment mobility is increased. Ordering results in more efficient photolysis. The aromatic ketones and diazo compounds as well as oligomers and polymers are particularly useful. Peroxides are similarly effective. The solubilization and cosolubilization of the aromaticglyoxy polymer with the sensitizers for purpose of film casting can be established by solubility parameter matching. Often dispersions, colloidal dispersions or emulsion are sufficient for film formation.

The unsaturated materials which advantageously can be combined with the aromaticglyoxy polymers of this invention may be defined as any monomer, oligomer or polymer having a single or multiple carbon to carbon unsaturation which is capable of contributing to the formation of an insoluble film when present with these aromaticglyoxy polymers. As such, these unsaturated materials may be generally represented by the following structural formula:

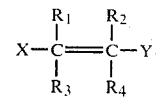

wherein X, Y, $R_1$, $R_2$, $R_3$, and $R_4$ may be hydrogen, alkyl, aryl, halo, acetyl, carbonyl, carboxy, carboxy ester, amide, sulfonyl, sulfonyl ester or amide, sulfonic, phosphonyl, phosphoryl and the esters and amides thereof. X, Y, $R_1$, $R_2$, $R_3$, and $R_4$ may be the same or different. X and Y additionally may be polymeric or they may be sites from which an unsaturated structure is pendant. Preferably, the species are liquids or solids. Normally gaseous species are acceptable only if they can be complexed to prevent losses in the cast films.

The preferred unsaturated materials which can be combined in photoreactive compositions with the aromaticglyoxy polymers of this invention are the polyfunctional, low molecular weight, acrylates and methacrylates, illustrative examples of which as well as other suitable unsaturated materials are set forth at column 10, line 28, through column 16, line 61, of the aforementioned U.S. Pat. No. 4,046,577.

These unsaturated materials may be used with the aromaticglyoxy substituted polymer or with both the aromaticglyoxy substituted polymer and the photosensitizers. Further, a mixture of two or more of these unsaturated materials may be advantageously employed with the aromaticglyoxy polymers of the present invention or with such aromaticglyoxy polymers and a mixture of two or more sensitizers. Oligomeric acrylics are preferred unsaturated materials for use in the compositions of the present invention.

Additives such as, for example, pigments, dyes, solvents, plasticizers, antihalation agents, adhesives, extenders, fillers, flow control agents, inhibitors, antioxidants, and other polymers may be used in the compositions of the present invention provided that they not adversely affect the compositions. Solvents used therein may be water based, organic or a mixture of both. Likewise, conventionally known plasticizers may be employed in these compositions such as phthalate esters, adipates, phosphates, and the like.

As previously indicated, the novel polymers of the present invention can also function as sensitizers, that is, they exhibit a property of absorbing light and transferring energy to the photosensitive material associated therewith to provide increased photosensitivity in a given photosensitive or photoreactive composition. As such, these photosensitizers can be used alone or in conjunction with other known sensitizers. Examples of additional sensitizing agents which can be used in conjunction with the compositions of this invention include Michler's ketone, picric acid, 2,4,6-trinitrobenzoic acid, 1,2-benzanthraquinone, 2,5-diphenyl-p-quinone, 4,4'-tetraethyl diamino diphenyl ketone, 4,4'-tetraethyl diaminodiphenyl carbinol, 4,4'-tetramethyl diamino benzophenone imide, 1-methy-2-benzoylmethylene-beta-naphthothiazoline, 4,4'-diazodistilbene-2,2'-disulfonic acid, and auramine base. Other sensitizers exhibiting similar properties and characteristics which may be used in conjunction with the photosensitizers of the present invention will be apparent to those skilled in this art. In this regard, it should be noted that the photoreactive coating compositions of the present invention do not require the addition of other sensitizers such as those identified above in order to exhibit satisfactory sensitivity.

In general, it has been found that when the photoreactive materials of the present invention are used in photosensitive coatings which include a monomer such as a vinyl or acrylic monomer that an antioxidant such as, for example, 2,6-di-tert-butyl-p-cresol or p,p'-biphenol also can be advantageously employed therewith.

It has been found that the composition of the present invention is also quite stable if stored away from light, however, in certain instances it may be desirable to include a small quantity of a polymerization inhibitor, such as, for example, hydroquinone, which is sufficient to maintain the stability of the composition but insufficient to prevent, or materially affect, polymerization when the composition is later exposed to actinic light.

In preparing products made with the polymers of the present invention, such as, for example, lithographic plates, a solution of these novel aromaticglyoxy substituted polymers alone, or in conjunction with other thermoplastic resins, photoinitiators, photosensitizers, and other optional constituents, is applied to a support for backing member in any manner such as spraying, whirler coating, and the like after which the solvent is evaporated either by air drying or heating to produce a thin film on the support member. Typically, the support member may comprise any rigid substrate and will be characterized by a surface which is hydrophilic and to which the film or coating of the photoreactive composition will adhere. Glass, paper, resin impregnated or reinforced paper, solid resinous sheets, or metal plates, such as aluminum, zinc, magnesium or copper having a coating providing the desired properties and characteristics may be used as the material of construction in the support member. In addition, the support member may be in plate, sheet or foil form and may be smooth or grained. For example, in the case of an aluminum plate backing member, the surface thereof may be anodized and treated with an aqueous alkali metal silicate, silicic acid or equivalent which provides the metal with a hydrophilic surface. Likewise, if desired, the base plate or backing member may be provided with a resinous coating which is adapted to receive the light sensitive coating material. Exemplary of resinous coatings of this type are those fully described in U.S. Pat. Nos. 3,073,723, 3,161,517 and 3,232,738.

It will be appreciated that the precise composition of the photosensitive coating solution will be variable to a considerable extent, with the usual requirement being that there be a sufficient amount of photoreactive materials in the solution to deposit a resultant coating on a backing member which will be able to provide an image area which possesses the desired coating thickness and toughness. In general, solvent solutions containing approximately ½% by weight to 10% by weight of the active photoreactive constituents have been found to be suitable for most purposes, including the production of presensitized lithographic plates. Preferably, the concentration of the aromaticglyoxy substituted polymer of the present invention and other thermoplastic resins which may be included therewith will be approximately 2% by weight based on the total weight of the solution. If additional photoinitiators or photosensitizers are used, the concentration thereof will usually range from about 0.1% to 20% by weight based on the weight of the other photoreactive constituents.

After the backing or support member has been coated with a film which includes the photoreactive materials of the present invention, it is dried and can be stored for extended periods of time until ready for use. If desired, heat may be used to insure that the residual solvent is driven off for the purpose of facilitating photoinsolubilization when the lithographic plate is exposed to a controlled actinic light source.

In use, the photosensitive coating is exposed to a controlled actinic light source, preferably a mercury lamp with a strong light output of between 250 and 500 nm. It will be appreciated, however, that a wide range of different light sources may be used, depending upon the particular structure of the photoreactive composition and whether or not additional sensitizers and/or initiators are used in conjunction therewith. The exposure to light is done through a stencil, negative, template or pattern to produce a desired light exposure or image area on the surface of the photoreactive coating. This exposure results in a photoinsolubilization within the coating at those locations which receive the light. The duration of exposure is, of course, widely variable depending upon the intensity and type of the light source, the precise composition of the coating, the thickness of the film, and the like. The unexposed areas remain soluble, thereby enabling the image to be solvent developable. In instances wherein water soluble photoreactive compositions are employed, the non-exposed areas can be washed away with a suitable water or alcohol based solution. The plate can then be desensitized in accordance with known techniques.

The exposed lithographic plate, if desired, may be developed through the use of any emulsion developer of the type well known in the art which causes the exposed surface underlying the light exposed photoreactive coating areas to be hydrophilic and the light exposed photoinsolubilized areas to become oleophilic in a single operation. Such developers eliminate the necessity of subsequently desensitizing the plate after development.

While not necessary, if desired, the coated plate may then be subjected to baking to increase further the strength of the insoluble polymeric image area. For example, the coating composition and support member may be oven baked at a temperature below the softening temperature of the support member, for example, below about 150° C. when an aluminum plate is used as the backing member. Also, a UV "bump" postexposure may be used.

It should be noted that while the foregoing description of a specific application of the materials of the present invention has been directed to the manufacture of lithographic plates, these novel compositions may be likewise advantageously used in other photochemical and photomechanical processes such as, for example, other printing processes, the preparation of etched electrical circuits, chemical milling and the like as well as in the preparation of photocurable inks and coatings which, for example, can be of a decorative or protective nature.

A preferred method for preparing the photoreactive composition of the present invention involves the glyoxylation of recurring aromatic groups in polymers such as, for example, polystyrene and vinyl naphthalene polymers. Preferably this glyoxylation involves Friedel-Crafts glyoxylation by reacting ethyloxalyl chloride in the presence of an anhydrous aluminum trichloride catalyst with a polymeric backbone structure which typically includes from 5 to 10,000 repeating monomeric units. The degree of glyoxylation, however, need not be complete. For example, glyoxylation of from 20 to 80 percent of the aromatic groups present in the backbone structure provides compositions which are eminently satisfactory.

The following examples are offered to illustrate the photoreactive compositions of the present invention and products made therewith.

EXAMPLE I

Preparation of Glyoxylated Polystyrene

In a two liter resin flask equipped with a motor driven stirrer and gas inlet and outlet, 41.6 g. (0.4 mole) of polystyrene (Dow Chemical PS-2) was dissolved in 600 g. of dry nitrobenzene. The flask was flushed with dry nitrogen gas and 32.8 g. (0.24 mol) of ethyl oxalyl chloride was added. Then, 76.6 g. (0.58 mole) of anhydrous aluminum chloride dissolved in 250 g. of dry nitrobenzene was added rapidly. Stirring and flushing with nitrogen gas were continued for one hour at which time the reaction mixture gelled. The flask was held overnight in an oil bath at 50° C. The reaction mixture was hydrolyzed by digging the gel out of the resin flask and adding it slowly to 800 ml. of rapidly stirred ice water containing 10 ml. of concentrated hydrochloric acid. Stirring was continued until all of the reddish gel particles had disappeared, giving a milky emulsion. This mixture was then steam distilled to remove all of the nitro-benzene.

Methyl isobutyl ketone (400 g.) was then added to dissolve the polymer which separated during the steam distillation. After prolonged stirring at 70°-80° C., only a portion of the polymer dissolved. The solvent layer was separated from the aqueous layer and residual insoluble material, and was washed with water several times. The solvent solution of the polymer was then dried and concentrated by evaporation at reduced pressure. The soluble portion of the polymer was determined by titration with dilute alkali to have 43 percent of its available sites glyoxylated.

EXAMPLE II

A dilute solution of the polymer of Example I was used to coat lithographic plates. The aluminum plates had previously been brush grained, anodized, and treated to render the surface permanently hydrophilic, as, for example, can be done with hot sodium silicate solution. The polymer was coated by pouring the solution on a rotating plate in a whirler coater, then allowing the solution to spread out and air dry briefly under infrared drying lamps. The resulting plate was exposed in a 5000 watt Berkey Addalux vacuum printing frame. The plate was developed with an aqueous solution of sodium silicate (2.4 weight percent) containing a small amount of a hydrophilic surfactant. Some difficulty was encountered in removing all of the coating from the unexposed areas of the plate. No image was apparent on the developed plate.

EXAMPLE III

To a dilute solution of the glyoxylated polystyrene polymer of Example I xanthone (xanthen-9-one) was added in an amount equal to one part by weight xanthone for each ten parts by weight of polymer. A lithographic plate was prepared, exposed and developed as in Example II. A faintly visible image was obtained.

EXAMPLE IV

To a dilute solution of the glyoxylated polystyrene polymer of Example I trimethylolpropane triacrylate and XD 8031, a low molecular weight acrylated novolac resin produced by Dow Chemical Company, were added in an amount equal to two parts by weight of each for each ten parts by weight of polymer. A lithographic plate was prepared, exposed and developed as in Example II. A readily visible image, showing several solid steps on a Stouffer sensitivity guide, was obtained.

While in the foregoing specification certain embodiments and examples of this invention have been described in detail, it will be appreciated that modifications and variations therefrom will be apparent to those skilled in this art. Accordingly, this invention is to be limited only by the scope of the appended claims.

We claim:

1. A device for use in photochemical and photomechanical processes comprising a backing member and a film applied thereto, said film including a polymer having as a recurring structure:

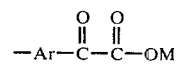

wherein Ar is a bivalent aromatic radical and M is selected from the class consisting of hydrogen, alkali metal, ammonium and substituted ammonium, said recurring structure being present in said polymer as pendant groups from the polymeric chain, and said polymer chain including as a recurring structure —CH$_2$—CH—O—.

2. The device of claim 1 wherein the

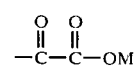

portion of said recurring structure is present in said polymer as pendant groups from the polymeric chain.

3. The devide of claim 1 wherein Ar is phenylene.
4. The device of claim 1 wherein M is hydrogen.
5. The device of claim 1 wherein Ar is phenylene and M is hydrogen.
6. The device of claim 1 wherein said polymer includes from 5 to 10,000 of said repeating units.
7. The device of claim 1 wherein said recurring units are attached to a backbone structure selected from the group consisting of aliphatic, aromatic, substituted aromatic, heterocyclic, metallocene, polyalkylene, polyalkylene oxide, polyester, polyurethane, polyamide, polysiloxane, polyalkylene imine, substituted polyalkylene, and phenolic derivatives.

* * * * *

UNITED STATES PATENT AND TRADEMARK OFFICE
CERTIFICATE OF CORRECTION

PATENT NO. : 4,268,608

DATED : May 19, 1981

INVENTOR(S) : Thaddeus M. Muzyczko and Thomas H. Jones

It is certified that error appears in the above-identified patent and that said Letters Patent are hereby corrected as shown below:

Column 3, line 44, "vedefined" should read --ve defined--

Column 5, line 56, "guinones" should read --quinones--

Column 9, line 59, "nitro-benzene" should read --nitrobenzene--

Column 11, line 3, "devide" should read --device--

Signed and Sealed this

First Day of December 1981

[SEAL]

Attest:

Attesting Officer

GERALD J. MOSSINGHOFF

Commissioner of Patents and Trademarks